United States Patent [19]

Dyer et al.

[11] 4,197,451

[45] Apr. 8, 1980

[54] TOTALIZER APPARATUS FOR RECORDING TWO DATA INPUTS ON A SINGLE CHANNEL

[75] Inventors: Robert E. Dyer, Springfield, Ill.; Frank M. Hyde, Marietta, Ga.

[73] Assignee: Sangamo Weston, Inc., Atlanta, Ga.

[21] Appl. No.: 903,202

[22] Filed: May 5, 1978

[51] Int. Cl.² ............................................. G06M 3/08
[52] U.S. Cl. ........................ 235/92 MT; 235/92 PL; 235/92 DE
[58] Field of Search ........ 235/92 PL, 92 MT, 92 EL, 235/92 DM, 92 SH, 92 DE; 360/6; 346/14 MR; 328/38, 39, 141, 133, 134; 340/205, 206

[56] References Cited

U.S. PATENT DOCUMENTS

| | | | |
|---|---|---|---|
| 3,573,637 | 4/1971 | Stebbins | 328/134 |
| 3,845,281 | 10/1974 | Konisi et al. | 235/92 PL |
| 3,947,664 | 3/1976 | Cox et al. | 235/92 PL |
| 3,978,727 | 9/1976 | Griverus | 235/92 PL |

Primary Examiner—Joseph M. Thesz
Attorney, Agent, or Firm—Emrich, Root, O'Keeffe & Lee

[57] ABSTRACT

A totalizer receives the output signals from two different sources, each generating signals representative of a measured event, such as the consumption (or transmission) of electrical power. The totalizer generates a train of recording pulses at a predetermined "offset" repetition rate. The totalizer increases the repetition rate of the recording pulses above the offset rate in response to an increase in the repetition rate of signals received from one of the sources; and it decreases the repetition rate of the recording pulses below the offset rate in response to an increase in the repetition rate of signals received from the other source. Thus the totalizer provides a bidirectional capacity in that it records events from two sources on a single data channel.

4 Claims, 3 Drawing Figures

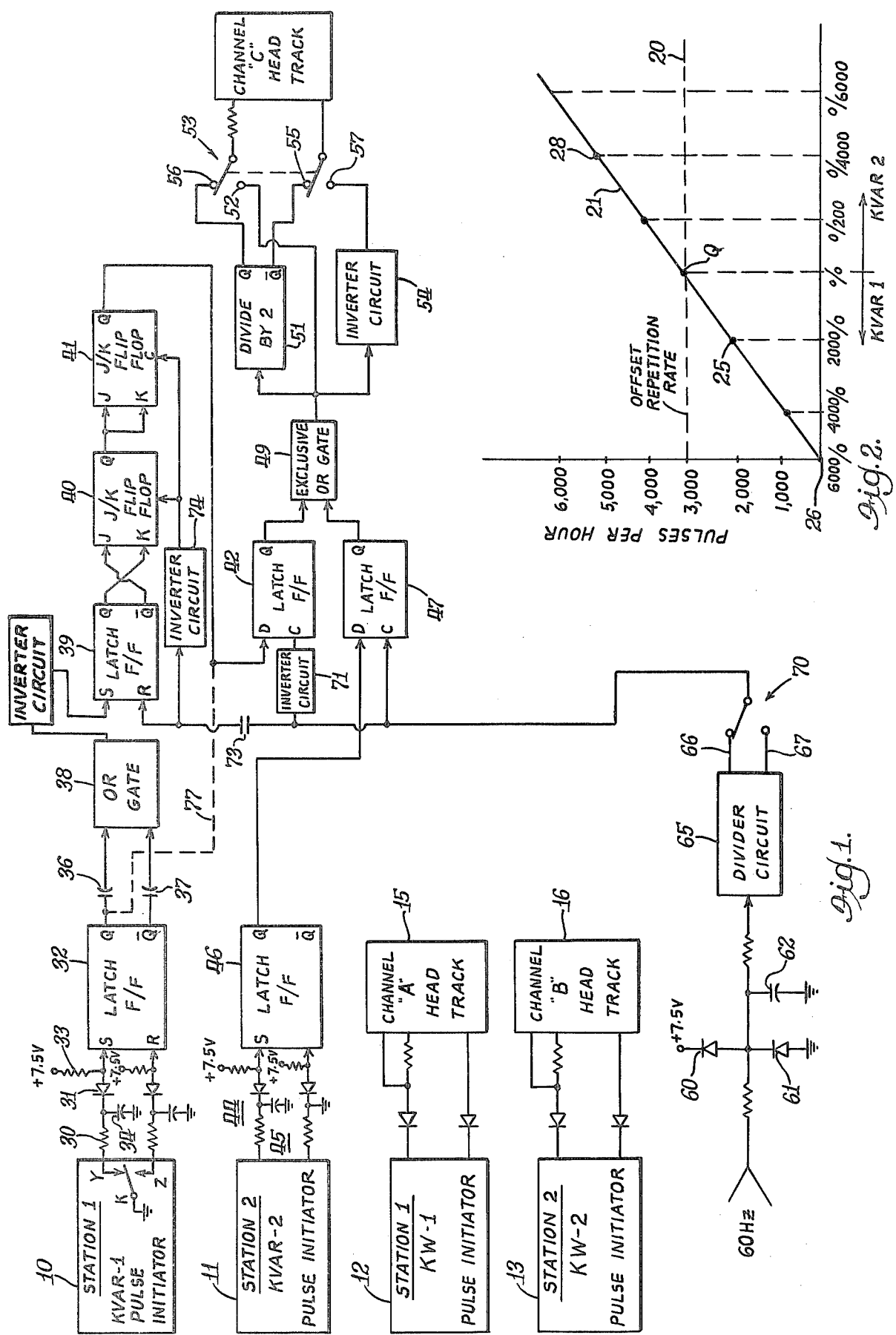

TOTALIZER APPARATUS FOR RECORDING TWO DATA INPUTS ON A SINGLE CHANNEL

BACKGROUND AND SUMMARY

The present invention relates to apparatus for magnetically recording events being measured or metered. Electric utility companies use magnetic recorders for billing and survey applications. Typically, a conventional rotating disc electrical power or energy meter is equipped with a pulse initiator for generating a train of electrical pulses representative of the quantity being measured, such as predetermined amounts of real or reactive power that have been consumed (or transmitted). These pulses are then recorded on a magnetic recorder having a tape moving at a very slow rate, such as 1.75 in. every fifteen minutes. To read a meter, the tape is replaced, and it is read by a "translator" at a remote location.

Utility companies commonly interconnect their power feed lines with one another so that if a demand is made on one utility that is above its present operating capacity, power may be drawn from the second utility. Such an interconnection is called an "intertie". Energy flowing between the utilities must be measured so that a record can be kept indicating which utility used what quantities of power during given time periods. The measurement of power is sometimes accomplished by a meter having a detent in the disc such that it will rotate only in one direction. Two of these meters are then used, with one meter measuring power transfer from the first utility to the second, and the other meter measuring power transfer from the second utility to the first.

If it is desired to record demand and usage in units of time, the electric meters are equipped with pulse initiators. These are devices which generate electrical pulses or signals having a repetition rate representative of the quantity of the parameter being measured. For example, the pulse initiator may generate an electrical pulse for each revolution of the rotating disc on a conventional power meter.

There are a number of magnetic recorders available for billing or survey applications. For example, there are two-track and four-track magnetic recorders which are commercially available for use in these applications. In either case, one track is used for recording time pulses or marks, leaving either one or three tracks available for recording data, depending upon the instrument selected.

If conventional billing recorders were used at a utility intertie, four energy meters would be required, two for real power (Kw) and two for reactive power (KVAR). Even in such a system, four separate data tracks would be required for complete recording of the parameters being measured. Since one track is required for time marks or pulses, a commercially available four-track recorder would not be sufficient to record all the data required at an intertie.

The present invention overcomes this difficulty by recording two separate inputs (such as reactive power from the two utilities) on a single data track on the recorder. A device which receives signals from pulse initiators associated with electric meters and accumulates them for recording on a magnetic cartridge is referred to as a "totalizer". The present invention is thus directed to a totalizer receiving data from two separate inputs for recording that data on a common data track of a magnetic recorder or other non-volatile memory, such as a "bubble" memory.

The totalizer generates a train of recording pulses at a predetermined "offset" repetition rate, preferably chosen in the mid range of the channel capacity of the recorder. For example, if the data track of the recorder is capable of recording 6,000 pulses per hour, the offset repetition rate may be chosen to be 3,000 pulses per hour. If both inputs are recording no transfer of power, the totalizer will record pulses on the common data track at a rate of 3,000 pulses per hour. The totalizer increases the repetition rate of the recording pulses above the offset rate in response to an increase in the repetition rate of signals received from one of the sources; and it decreases the repetition rate of the recording pulses below the offset rate in response to an increase in the repetition rate of the signals received from the other source. Thus, the totalizer of the present invention provides a bidirectional capacity in that it enables the recorder to record events from two sources on a single data track.

Other features and advantages of the present invention will be apparent to persons skilled in the art from the following detailed description of a preferred embodiment accompanied by the attached drawing wherein identical reference numerals will refer to like parts in the various views.

THE DRAWING

FIG. 1 is a functional block diagram of a system incorporating the present invention;

FIG. 2 is a graph illustrating the relationship between pulse rate for both input channels and recorded pulse rate for the bidirectional totalizer of FIG. 1.

DETAILED DESCRIPTION

Figure 3:
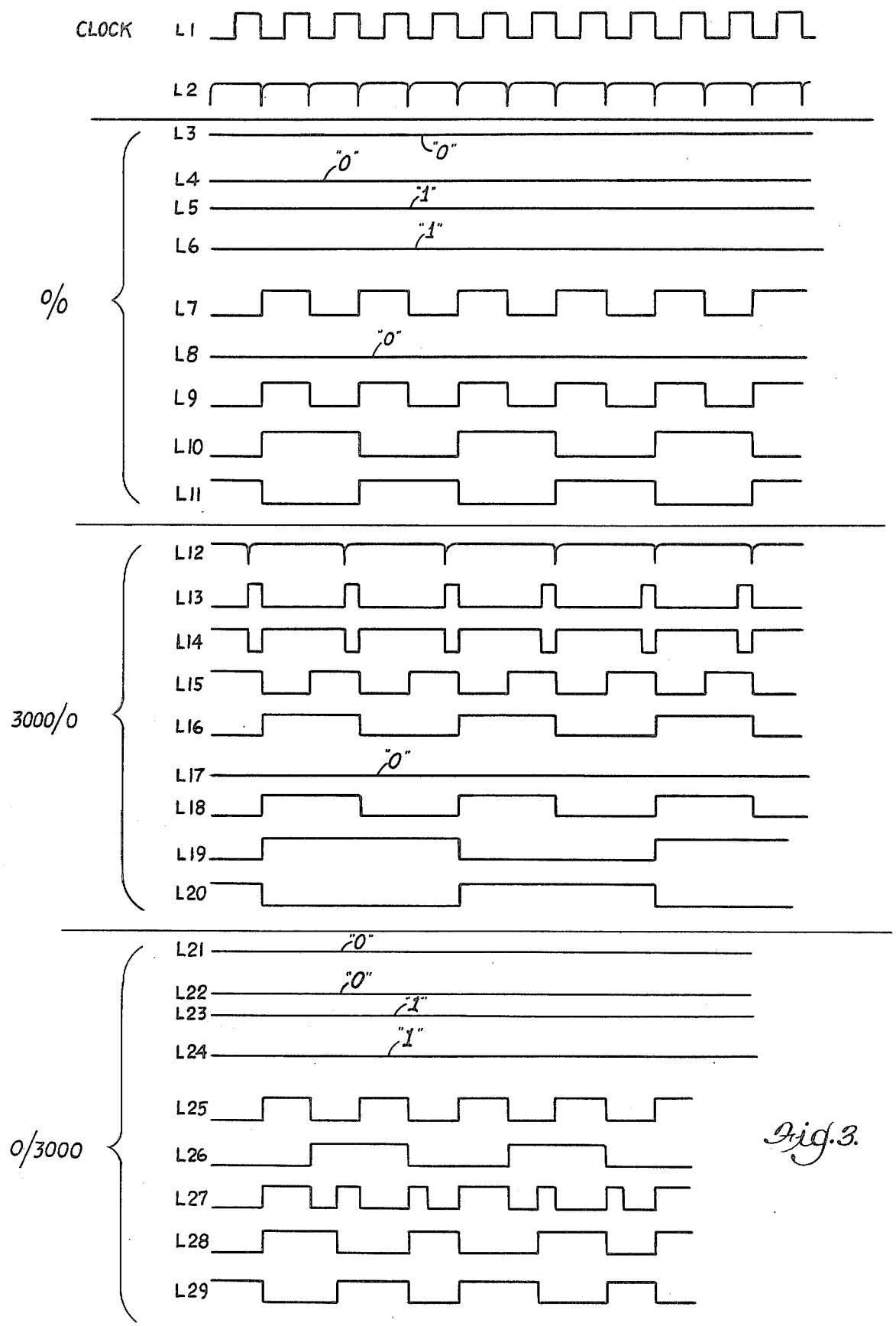
FIG. 3 is a timing diagram illustrating the various voltages of the apparatus of FIG. 1 under different input rate conditions.

Referring first to FIG. 1, reference numerals 10-13 identify respectively four separate pulse initiators. These pulse initiators may be of the type sold under the designation SPI Pulse Initiator by Sangamo Weston, Inc. of West Union, South Carolina. These pulse initiators may be associated with meters measuring reactive volt-amperes, such as the initiators 10 and 11, or they may be associated with kilowatt meters, such as those designated 12 and 13.

Each pulse initiator of this type uses light emitting diodes, photo transistors and power transistors; however, each initiator can be diagrammatically illustrated as a single-pole, double-throw switch, including terminals designated K, Y and Z for the pulse initiator 10. The K terminal which represents a movable arm is grounded; and the Y and Z terminals represent respectively the output terminals of the pulse initiator. The function of the pulse initiators is to detect or sense "events", such as the consumption of real or reactive power. Typically, this is done by detecting the rotation of a disc on a conventional meter mechanism which has been equipped with a pulse initiator. Each time an "event" is sensed, the wiper arm moves from one of the contacts Y and Z to the other.

Pulse initiator 10 is associated with a reactive power meter which measures reactive power transmitted from station 1 to station 2. Pulse initiator 11 is associated with a reactive power meter which measures reactive power transmitted from station 2 to station 1. Pulse initiator 12 is associated with a meter which measures real power transmitted from station 1 to station 2; and pulse initiator 13 is associated with a real power meter which measures real power transmitted from station 2 to station 1.

A separate pulse initiator (not shown) is used for generating a time signal on a time track of a magnetic cartridge recorder, such as the four-track magnetic recorder model MCR-4, also sold by Sangamo Weston, Inc. Thus, there are three data tracks. The output of pulse initiator 12 is recorded on channel "A" of the magnetic recorder, diagrammatically illustrated by the block 15. The output of pulse initiator 13 is stored on channel "B", designated 16. The combined outputs of pulse initiators 10 and 11 are stored on channel "C" designated 17, and comprising the third data track of the magnetic recorder.

Before discussing the circuitry of FIG. 1 in more detail, it is believed that it would be helpful for understanding the operation of the circuitry if its overall function were first understood. For this purpose, reference is made to the graph of FIG. 2. The magnetic recorder indicated above has a recording capacity for each channel of 6,000 pulses per hour (indicated on the ordinate of FIG. 2). In this system, an offset repetition rate of 3,000 pulses per hour (indicated by the horizontal dashed line 20) is chosen as a quiescent operating state--that is, 3,000 pulses per hour will be recorded on channel C if no reactive power is transmitted between either station. This operating point is designated Q in FIG. 2; and the line 21 represents the relationship between the actual pulses recorded and the events that have been measured.

For simplicity in explaining the invention by way of example, it will be assumed that only one station is transmitting power at a given time, although the system is not so limited. By way of example, then, if reactive power is transmitted from station 1 to station 2, pulses will be recorded at a rate less than 3,000 pulses per hour; and the rate actually recorded, when subtracted from the offset repetition rate of 3,000 pulses per hour is representative of the amount of reactive power transmitted from station 1 to station 2. By reversing the meters, the pulse initiator 10 could be set up to measure reactive power consumed by station 1, rather than transmitted by it as explained in this example. Further, in this example, there is a 2:1 compression ratio of pulses generated by the pulse initiator and those actually recorded. Thus, if pulse initiator 10 generates pulses at the rate of 2,000 per hour, then the actual recording rate will diminish by 1,000 per hour so that a net recording rate of 2,000 per hour is established, as indicated by operating point 25 on the curve 21. This linear relationship continues to the point where station 1 pulse initiator generates at a rate of 6,000 pulses per hour; and in this condition, no pulses are actually recorded on channel C, indicated by operating point 26 in FIG. 2.

On the other hand, if pulse initiator 10 generates pulses, then the actual number of pulses recorded on channel C will exceed the offset repetition rate of 3,000 per hour--again employing a compression ratio of 2:1. Thus, if pulse initiator 11 generates pulses at a repetition rate of 4,000 per hour, operating point 28 of FIG. 2 is reached, and the actual recording rate is 5,000 pulses per hour on the channel C data track.

Returning now to FIG. 1, the Y terminal of the pulse initiator 10 is connected through a resistor 30 and a diode 31 to the set input S of a latch flip flop 32. The set input of the flip flop 32 is connected through a bias resistor 33 to a +7.5 v. supply; and the junction between the resistors 30 and capacitor 31 is connected to ground through a capacitor 34. The resistor 30 and capacitor 34 form a filtering function, and the diode 31 acts to de-couple any positive voltages from the input to the flip flop.

The reset input of the latch flip flop 32 is connected through a similar filtering and de-coupling network to the Z terminal of the pulse initiator 10. The flip flop 32 and its associated input networks compensate for any "bounce" or noise from the pulse initiator 10. The latch 32 (as well as other latches) is a conventional flip flop comprising cross-coupled NAND gates. Thus, when the S input is low (0), the Q output is high (1) and vice versa. For each state change of the pulse initiator, the latch changes state; and these state changes are sometimes referred to as "pulses" because they produce corresponding flux changes on the recording medium which, when read back, do in fact produce pulses. Further, these changes in signal levels are easily made pulses through differentiation.

The outputs of the flip flop 32 are connected through capacitors 36, 37 respectively to the inputs of a logical OR gate 38. The combination of capacitors and OR gate functions as an edge-detecting one-shot for setting a latch 39 on any state change of latch 32. The Q output of the latch flip flop 39 is connected to the K input of a J/K flip flop 40 (which is used as a one-bit shift register); and the $\overline{Q}$ output of the flip flop 39 is connected to the J input of flip flop 40. The Q output of flip flop 40 is connected to both the J and K inputs of a second J/K flip flop 41. The Q output of the flip flop 41 is connected to the D (i.e. "data") input of a latch flip flop 42.

As already mentioned, the pulse initiator 11 is similar in structure and operation to the one already disclosed at 10; and its outputs are connected through filtering and de-coupling networks 44, 45 of the type already discussed to the set and reset inputs respectively of the latch flip flop 46 which performs a function identical to that performed by the previously discussed latch flip flop 32. The Q output of the latch flip flop 46 is connected to the D input of a latch flip 47.

The Q outputs of the flip flops 42 and 47 are connected respectively to the inputs of an EXCLUSIVE OR gate 49. The output of gate 49 is connected to a "divide by 2" circuit 51, to a terminal 52 of one deck of a two-deck single-pole double-throw switch generally designated 53, and to the input of an inverter circuit 54. The wiper arms of the switch 53 are connected to the inputs of the channel C head track 17. The divide by 2 circuit 51 has a normal output Q and a complementary output $\overline{Q}$. The Q output is connected to a terminal 56 of the first deck of switch 53; and the complementary output is connected to the terminal 55 on the second deck of that switch. The output of inverter circuit 54 is connected to the second terminal 57 on the second deck of the switch 53.

Turning now to the lower left hand corner of FIG. 1, a 60 Hz. voltage is fed to a shaping network including first and second diodes 60, 61 and a filtering capacitor 62. The diode 61 rectifies negative half cycles of the 60 Hz. voltage, and the cathode of the diode 60 is connected to a +7.5 v. source. Hence, the signal at the junction between the two diodes is a positive-going signal which is limited to +7.5 v. This signal is fed to the input of a divider circuit 65, which may be of a conventional design for dividing the input frequency. The divider circuit 65 has first and second outputs 66, 67. The divider circuit 65 which may also include a shaping network (such as a Schmitt trigger) generates an output signal on the line 66 which has a repetition rate or frequency equal to the frequency of the input signals divided by 36. The signal on output 67 has a repetition rate equal to the frequency of the input signal divided by 72. A switch generally designated 70 is used to select one of the outputs of a divider circuit 65, and it is directly connected to the clock input of flip flop 47, through an inverter 71 to the clock input of flip flop 42, and to a capacitor 73. The other terminal of the capacitor 73 (which is used to differentiate the clock signal) is connected directly to the reset input of flip flop 39 and, through an inverter 73 to the clock inputs of the flip flops 40, 41.

In the case where it is desired to use the apparatus as a simple totalizer--that is, where it is desired to record the events from both pulse initiators 10 and 11 in an accumulative fashion, the junction between capacitor 36 and the input of OR gate 38 may be directly connected to the D input of the latch flip flop 42, as diagrammatically represented by the dashed line 77.

When operating in the mode of a simple totalizer, as mentioned, it is desired to record in a cumulative fashion the events from both pulse initiators 10 and 11. In this case, the Q output of the latch 32 is directly connected to the D input of latch 42. Let it be assumed that the system is set (by means of switches 53 and 70) to record a maximum of 6,000 events per hour. In this case, the clock rate from the divider circuit 65 is 6,000 cycles per hour. Since it is possible to receive a total of 12,000 events per hour in this mode, the switch 53 is set to the position shown in the drawing so that the "Divide By 2" circuit 51 is interposed between the output of the EXCLUSIVE OR gate 49 and the recorder. The clock signal is fed to the clock input of the flip flops 42, 47; and these clock signals are 180° out of phase because of the inverter 71.

In a preferred embodiment, the circuitry included in the boxes 38, 39, 40, 41 and 74, as well as the capacitor 73, are mounted on a common circuit board so that in this mode of operation, these circuits are removed since they are not used.

SIMPLE TOTALIZER

In the case of a simple totalizer, the outputs of the initiators 10, 11 are represented as changes in signal levels at the outputs of the latch circuits 32, 46 respectively. These outputs are fed directly to the D inputs of latch circuits 42, 47 which are clocked 180° out of phase. Assuming that the pulse initiator 10 has sensed an event and the Y terminal of initiator 10 is connected to the K terminal (i.e. grounded) whereas the pulse initiator 11 has not sensed an event, the D input of the flip flop 42 will be a 1. When the circuit is clocked, the inputs to the EXCLUSIVE OR gate 49 will be 1 and 0 respectively so its output will be a 1. This will cause an appropriate signal to be recorded on the C channel. In the illustrated embodiment, assuming an NRZ recording scheme, it will be assumed that a positive flux level is recorded on the tape when the output of the gate 49 is a 1.

The system will continue to record the same flux level until another event is detected--either by initiator 10 or initiator 11. If the event is detected by initiator 10, then the input to latch 42 becomes 0, and during the next clock cycle, both inputs to the EXCLUSIVE OR gate 49 will be 0, thereby causing its output to go to 0 and recording a negative flux level on the tape. If the next event had been detected in initiator 11, the input to latch 47 would become a 1, and both inputs to the gate 49 would be 1, and its output would be 0, again, changing the polarity of recorded flux on the tape. In summary, the output level of the EXCLUSIVE OR gate 49 determines the polarity of current in the recording head which, in turn, defines the flux polarity on the magnetic tape. A change in flux level records an event because the playback head will generate a pulse in response to an abrupt change in flux level.

If both initiators sense an event substantially simultaneously (i.e. during one half cycle of the clock signal), then both inputs to the latches 42, 47 will change. During the next clock signal, the input to the gate 49 will change, thereby causing its output to change and record an event. The second successive clock signal will likewise change the input of the gate 49 so that its output will revert to the first state; and it will be appreciated that the circuitry thus records both events, but spaces them consistent with the maximum recording rate of the system. By clocking the latches 42, 47 with complementary signals, the output of only one latch will change at a given time, thereby reversing the input state of the gate 49 at each half cycle of clock, which is twice the desired recording rate in this example. However, the Divide By 2 circuit 51 produces the desired recording repetition rate.

To summarize operation in this mode, if the state of one pulse initiator changes, a flux change is produced on the track 17. A subsequent flux change (recorded pulse) is generated only if there is a change in one of the pulse initiators. If a change occurs simultaneously (that is, within one clock cycle depending upon the state of the clock when the change occurs), both events will be recorded in sequence by virtue of clocking the latches 42, 47 with complementary clock signals. If events occur at a rate higher than the maximum recording repetition rate as determined by the switches 70 and 53, the events occurring at a rate higher than this rate will not be recorded, although events will be recorded at the maximum set rate.

BIDIRECTIONAL TOTALIZER

As indicated above, when used in the bidirectional mode, the system records events from both pulse initiators 10 and 11 with the repetition rate of recorded signals being representative of the measurement for each source. It is believed that understanding of the operation of the system as a bidirectional totalizer would be facilitated if it were assumed that only one pulse initiator is recording events at any given time, as is normally the case for very short time intervals. Since the system is responsive to the rate of detected events over a short period of time (determined by the clock signal), the rate can be thought of as changing instantaneously once the operation is understood for the various conditions.

Assuming first that neither pulse initiator is generating an output, let it be assumed that the clock rate is 6,000 cycles per hour as indicated on line L1 of FIG. 3. The latch circuit 39 may be a pair of cross-coupled NAND gates and an inverter connected between the output of OR gate 38 and the set input of latch 39. The latch circuit 39, is reset on the negative going edge of the clock, after being differentiated by capacitor 73.

The reset signal for latch 39 is shown on line L2 of FIG. 3.

Lines L3–L11 of FIG. 3 relate to the example being discussed wherein no events are being recorded from either pulse initiator 10 or 11. In this case, the inputs to OR gate 38 are both 0's, and the input to latch 39 is therefore 0 as indicated on line L3 of the timing diagram.

The Q output of latch 39 is shown to be a 0 at line L4, and the $\overline{Q}$ output is a 1, as seen on line L5. Thus, the Q output of the shift register 40 is a steady 1 level, see line L6. With a logical 1 in both the J and K inputs of the flip flop 41, the output will reverse at each clock input (which is fed through inverter 74 and capacitor 73). The resulting output of the latch 41 is shown at line 7 of FIG. 3, and it can be seen to be a train of pulses having a repetition rate equal to one half the repetition rate of the clock (line L1). This is the signal that is fed to the data input of the latch 42.

The signal fed to the data input of latch 47 is a steady 0 level, as seen at line L8 of FIG. 3. Thus, the output signal of latch 42 (which is clocked through the inverter 71) has a repetition rate equal to that of the flip flop 41. The resulting output of the EXCLUSIVE OR gate 49 also has the same repetition rate, as seen at line L9, because the other input to the EXCLUSIVE OR gate is a steady 0 signal. The resulting signals at the outputs of the Divide By 2 circuit 51 is shown in lines L10 and L11 for the Q and $\overline{Q}$ outputs respectively. Each time the signal level changes, the flux level will change, resulting in a recording signal or "pulse", so that the recording rate is 3,000 pulses per hour or one half the clock rate. This is indicated by the operating point Q on FIG. 2, as explained above.

In order to facilitate an understanding of the circuitry for other input rates, it will be assumed that the pulse initiator 11 remains in a non-active state, generating 0 outputs per hour and that the repetition rate from the pulse initiator 10 increases to 3,000 pulses per hour. The signals associated with the set of conditions are those on lines L1 and L2 (described above as being the clock rate and the reset rate for the latch 39) together with lines L12–L20. The signal on line L12 indicates negative pulses fed to the set input of the latch circuit 39 via OR gate 38 at a rate of 3,000 per hour. Thus, the latch 39 is in a set condition for every second clock signal. In other words, the signals at the J and K inputs to flip flop 40 are 0 and 1 respectively when the flip flop is clocked. The delay through the latch 39 is greater than the delay through the inverter circuit 74 so that the output of latch 39 is clocked through the register 40 before the latch outputs change in response to reset by the clock. Each succeeding event signal thus has the effect of cancelling one clock pulse from passing to the shift register 40 because it sets the latch 39 after the latch has been reset by the clock.

Each set input to the latch 39 causes its Q output to go to a 1, as indicated in line L13; then reset at the negative edge of each clock. The complementary or $\overline{Q}$ output is shown at line L14, and it is this input which is fed to the J input of the flip flop 40. The output of the shift register flip flop 40 is shown at line L15. The output of flip flop 41 is shown on line L16.

The signal on line 17 is a steady 0 signal, again representing the input to the latch 47; and the signal on line 18 is the output of the EXCLUSIVE OR gate 49, which is the same as the signal to the date input of the latch 42 because the pulse initiator 11 is not generating output pulses. The signals on lines L19 and L20 represent the complementary outputs of the Divide By 2 circuit 51; and it can be seen that the resulting repetition rate of recorded pulses is one half (i.e. 1500 per hour) the repetition rate of recording of pulses on lines L10 and L11.

Thus, in general, it can be seen that when the pulse initiator 11 is not generating pulses and the pulse initiator 10 is generating pulses, each pulse (or state change) generated by the initiator 10 reduces by one the number of 1's that would otherwise be shifted to the output of the shift register 40. In the limiting case, where there are 6,000 pulses per hour being generated by pulse initiator 10, then it can be seen that the pulses on line L12 (as well as the repetition rate of the signals on lines L12–L16) will double, thereby cancelling each clock pulse attempting to be shifted through the shift register 40. Turning now to the case where the pulse initiator 10 is inactive (i.e., generates 0 pulses per hour), and the pulse initiator 11 generates pulses at the rate of 3,000 per hour, reference is made to lines L1–L2 and L21–L29. Again, the clock repetition rate (L1) is the same and the reset rate for the latch 39 remains constant (line L2).

In this example, the set input to latch 39 is a steady 0 signal, as indicated at line L21. Thus, the Q output has a 0 signal, as indicated at line L22; and the $\overline{Q}$ output of latch 39 has a 1 signal (line L23). With a 1 coupled to the J input of the register 40, the resulting output is a constant 1 level, line L24. The output of flip flop 41, with both inputs at 1 is shown at L25; this is also the data input of the latch 42. The input from the pulse initiator 11 to the latch 47 is shown at line L26 as having a repetition rate of 3,000 per hour. The resulting output of the EXCLUSIVE OR gate 49 is shown on line L27. It will be appreciated that the signal fed to the EXCLUSIVE OR gate 49 from the latch 42 is the same as the signal shown in line 25 but shifted one half clock cycle to the right. By comparing the resulting signal with that shown on line L26 and performing an EXCLUSIVE OR function, the signal shown on line L27 is generated. When this signal, in turn, is fed through the Divide By 2 circuit 51, the resulting complementary outputs are shown at lines L27 and 28 respectively, and this produces a recording rate of 4500 pulses per hour (comparing line L28 with L10 for example). The same is true as the repetition rate increases from pulse initiator 11. In the limiting case where the pulse initiator 11 generates at a rate of 6,000 per hour and the pulse initiator 10 is inactive, 6,000 pulses per hour will be recorded on the tape.

In summary, when neither pulse initiator generates an output, the system generates recording pulses at a predetermined constant repetition rate, called the offset repetition rate. If pulse initiator 10 begins to generate pulses, the system cancels or subtracts some of the recording pulses so that the difference between the offset repetition rate and the actual recording rate is representative of the pulse rate of initiator 10 (by a factor of two in the example). If pulse initiator 11 generates pulses, the system increases or adds recording pulses to the offset repetition rate so that the difference between the actual pulse rate recorded and the offset repetition rate is representative of the pulse rate from the initiator 11 (again, by a factor of two).

In the illustrated embodiment, the recording medium was indicated to be magnetic tape. However, persons skilled in the art will appreciate that other non-volatile memory may equally well be employed. For example, the output signal of the totalizer (taken either from the EXCLUSIVE OR gate 49 or the divider circuit 51 if it is used), could be fed into a counter or register, and then the contents of the register could be shifted into a memory periodically. Thus, each "word" stored in memory would comprise digitally encoded signals representative of a totalized count per unit time (i.e., for a given time interval). The count stored in each time interval would correspond to the pulses per hour on the ordinate of FIG. 2.

Having thus disclosed a preferred embodiment of the invention, persons skilled in the art will be able to modify certain of the structure which has been disclosed and to substitute equivalent elements for those shown while continuing to practice the principle of the invention; and it is, therefore, intended that all such modifications and substitutions be covered as they are embraced within the spirit and scope of the appended claims.

We claim:

1. Apparatus for totalizing pulses from at least first and second pulse initiators, each generating output pulses representative of a measured quantity, comprising: clock means generating a clock signal of a first fixed repetition rate; first circuit means responsive to the output signal of said first initiator for generating a first signal having a repetition rate representative of the pulse rate from said first initiator; second circuit means responsive to the output signal of said second initiator for generating a second signal having a repetition rate representative of the repetition rate of said second initiator; and logic circuit means responsive to said clock signal and said first and second signals for generating an output signal having an offset repetition rate of predetermined relationship with the repetition rate of said clock signal when said first and second circuit means generate output signals of zero repetition rate, said logic circuit means subtracting pulses from said offset repetition rate in predetermined relationship to the repetition rate of pulses from said first circuit means, and adding pulses to said offset repetition rate in predetermined relationship to the repetition rate of pulses from said second circuit means.

2. The apparatus of claim 1 wherein said logic circuit means includes first and second latch circuits, said second latch circuit receiving said second signal; a third latch circuit receiving said first signal and being reset by said clock signal; a one-bit shift register receiving the complementary output signal of said third latch circuit; a J/K flip flop receiving the output signal of said shift register and having its output coupled to the input of said second latch circuit, said shift register and said J/K flip flop being clocked by a signal at the repetition rate of said clock signal; EXCLUSIVE OR circuit means receiving the outputs of said first and second latch circuits; and means for connecting said clock signal to one of said latch circuits and the complement of said clock signal to the other of said latch circuit means.

3. Apparatus for recording signals wherein the repetition rate of a recorded signal is representative of measured quantities of a parameter from at least two different sources comprising first circuit means for generating a first signal having a repetition rate representative of said measured quantities of said first source; second circuit means for generating a second signal having a repetition rate representative of said measured quantities of said second source; a source of clock signals of predetermined repetition rate; logic circuit means for generating an output signal having a repetition rate of predetermined relationship to the repetition rate of said source of clock signals; third circuit means receiving said first signal for reducing the repetition rate of said output signal proprotional to the repetition rate of said first signal; fourth circuit means responsive to said second signal for increasing the repetition rate of said output signal in proportion to the repetition rate of said second signal; and recorder means for recording signals representative of said output signal.

4. Apparatus for recording signals wherein the repetition rate of a recorded signal is representative of measured quantities of a parameter from first and second sources comprising: first circuit means for generating a first train of pulses having a repetition rate representative of said quantities of said first source; second circuit means for generating a second train of pulses having a repetition rate representative of said quantites of said second source; first and second resettable latch circuits, each having a data input and a clock input, the data inputs of said first and second latch circuits receiving respectively, said first and second trains of pulses; means for generating a clock signal; means for clocking said first and second latch circuits with said clock signal and the complement of said clock signal respectively; and EXCLUSIVE OR gate circuit means having first and second inputs receiving respectively the output signals of said first and second latch circuit means, whereby the output signal of said EXCLUSIVE OR gate circuit means is a binary signal which changes from one state to the other for each pulse in either of said first and second pulse trains up to a predetermined rate equal to the repetition rate of said clock signal; and storage means for storing signals representative of state changes in the output signal of said EXCLUSIVE OR gate circuit means.

* * * * *

UNITED STATES PATENT AND TRADEMARK OFFICE
CERTIFICATE OF CORRECTION

PATENT NO. : 4,197,451
DATED : April 8, 1980
INVENTOR(S) : Robert E. Dyer et al

It is certified that error appears in the above-identified patent and that said Letters Patent are hereby corrected as shown below:

Column 3, line 59, "10" should read -- 11 --.

Column 4, line 4, "resistors" should read -- resistor --.

Column 4, line 4, "capacitor" should read -- diode --.

Column 4, line 44, insert -- flop -- after "flip".

Column 5, line 16, "73" should read -- 74 --.

Column 7, line 15, "7" should read -- L7 --.

Column 7, line 66, "18" should read -- L18 --.

Column 8, line 25, "Q" should read -- $\bar{Q}$ --.

Claim 3, column 10, line 8, insert a colon after "comprising".

Claim 3, column 10, line 19, "proprotional" should read -- proportional --.

UNITED STATES PATENT AND TRADEMARK OFFICE
CERTIFICATE OF CORRECTION

PATENT NO. : 4,197,451
DATED : April 8, 1980
INVENTOR(S) : Robert E. Dyer et al

It is certified that error appears in the above-identified patent and that said Letters Patent are hereby corrected as shown below:

In the Drawings:

Fig. 1, Channel "C" Head Track should be labeled -- 17 --.

Fig. 1, the reset input of latch flip flop 46 should be labeled -- R --.

Signed and Sealed this

Seventh Day of September 1982

[SEAL]

Attest:

GERALD J. MOSSINGHOFF

Attesting Officer

Commissioner of Patents and Trademarks